US012143243B2

(12) United States Patent
O'Keeffe et al.

(10) Patent No.: US 12,143,243 B2
(45) Date of Patent: Nov. 12, 2024

(54) SCHEDULER-DIRECTED SOURCE MULTIPLEXING FOR RETURN PATH NOISE MITIGATION

(71) Applicant: ARRIS Enterprises LLC, Suwanee, GA (US)

(72) Inventors: Francis J. O'Keeffe, Glounthaune (IE); Thomas J. Cloonan, Lisle, IL (US); Chris R. Zettinger, Wheaton, IL (US); Zoran Maricevic, West Hartford, CT (US); Michael B. Harrington, Cork (IE); Oleksandr Volkov, Cork (IE)

(73) Assignee: ARRIS Enterprises LLC, Suwanee, GA (US)

( * ) Notice: Subject to any disclaimer, the term of this patent is extended or adjusted under 35 U.S.C. 154(b) by 0 days.

(21) Appl. No.: 17/686,214

(22) Filed: Mar. 3, 2022

(65) Prior Publication Data

US 2022/0286323 A1     Sep. 8, 2022

Related U.S. Application Data

(60) Provisional application No. 63/156,174, filed on Mar. 3, 2021.

(51) Int. Cl.
| | | |
|---|---|---|
| *H04B 7/12* | | (2006.01) |
| *H03M 1/00* | | (2006.01) |
| *H04L 5/00* | | (2006.01) |
| *H04L 12/433* | | (2006.01) |
| *H04L 12/64* | | (2006.01) |

(52) U.S. Cl.
CPC ........ *H04L 12/6418* (2013.01); *H03M 1/001* (2013.01); *H04L 5/0007* (2013.01); *H04L 12/433* (2013.01); *H04L 2012/6437* (2013.01); *H04L 2012/6459* (2013.01); *H04L 2012/6472* (2013.01)

(58) Field of Classification Search
CPC ................. H04L 12/433; H04L 5/0007; H04L 2012/6437
See application file for complete search history.

(56) References Cited

U.S. PATENT DOCUMENTS

| | | | | |
|---|---|---|---|---|
| 5,953,348 | A * | 9/1999 | Barn .......................... | H04J 4/00 370/468 |
| 6,137,793 | A | 10/2000 | Gorman et al. | |
| 10,616,622 | B2 * | 4/2020 | Zinevich .................. | H04B 3/46 |
| 10,841,030 | B2 * | 11/2020 | Kliger ............... | H04L 27/26524 |
| 2005/0010958 | A1 * | 1/2005 | Rakib .................. | H04L 27/0002 725/111 |

(Continued)

OTHER PUBLICATIONS

International Search Report and Written Opinion RE: Application No. PCT/US2022/018779, dated May 23, 2022.

*Primary Examiner* — Abdelnabi O Musa
(74) *Attorney, Agent, or Firm* — Chernoff, Vilhauer, McClung & Stenzel, LLP

(57) ABSTRACT

Devices, systems and methods that reduce funneling noise in upstream data transmissions from modems providing the transmissions through respective RF legs connected to the node. Preferred devices and systems may include a node that is configured to selectively isolate respectively scheduled upstream data signals from noise present on any RF leg not propagating a scheduled upstream data signal.

20 Claims, 11 Drawing Sheets

(56) References Cited

U.S. PATENT DOCUMENTS

| | | | |
|---|---|---|---|
| 2010/0100919 A1* | 4/2010 | Hsue | H04L 12/2801 |
| | | | 725/111 |
| 2015/0295838 A1 | 10/2015 | Liu et al. | |
| 2017/0019347 A1 | 1/2017 | Al-Banna et al. | |
| 2017/0237492 A1 | 8/2017 | Mutalik et al. | |
| 2019/0044555 A1* | 2/2019 | Hewavithana | H04B 1/0475 |
| 2019/0132111 A1* | 5/2019 | Hamzeh | H04B 3/00 |
| 2019/0326949 A1* | 10/2019 | Jin | H04L 5/1461 |
| 2020/0036463 A1* | 1/2020 | Kliger | H04L 12/2801 |
| 2020/0059206 A1* | 2/2020 | Williams | H04L 5/14 |
| 2020/0313721 A1* | 10/2020 | Jin | H04L 12/2801 |
| 2021/0067397 A1* | 3/2021 | Liston | H04L 27/01 |

\* cited by examiner

| Modem | RF Distribution Leg |
|---|---|
| Modem_A1 | RF Leg A |
| Modem_A2 | RF Leg A |
| Modem_B1 | RF Leg B |
| Modem_B2 | RF Leg B |
| Modem_C1 | RF Leg C |
| Modem_C2 | RF Leg C |
| Modem_D1 | RF Leg D |
| Modem_D2 | RF Leg D |

FIG. 8

SCHEDULER-DIRECTED SOURCE MULTIPLEXING FOR RETURN PATH NOISE MITIGATION

CROSS REFERENCE TO RELATED APPLICATIONS

This application claims benefit of priority under 35 USC § 119(e) of U.S. Provisional Application No. 63/156,174, filed Mar. 3, 2021, the contents of which are incorporated by reference herein in its entirety.

BACKGROUND

The subject matter of this application generally relates to systems and methods that reduce noise in an upstream path of a communications system.

Communications networks, such as Cable Television (CATV) networks, have historically provided content to large groups of subscribers from a central delivery unit, called a "head end," which distributes channels of content to its subscribers from this central unit through a branch network comprising a multitude of intermediate nodes. Modern CATV service networks, however, not only provide media content such as television channels and music channels to a customer, but also provide a host of digital communication services such as Internet Service, Video-on-Demand, telephone service such as VoIP, and so forth. These digital communication services, in turn, require not only communication in a downstream direction from the head end, through the intermediate nodes and to a subscriber, but also require communication in an upstream direction from a subscriber, and to the content provider through the branch network.

To this end, these CATV head ends include a separate Cable Modem Termination System (CMTS), used to provide high speed data services, such as video, cable Internet, Voice over Internet Protocol, etc. to cable subscribers. Typically, a CMTS will include both Ethernet interfaces (or other more traditional high-speed data interfaces) as well as RF interfaces so that traffic coming from the Internet can be routed (or bridged) through the Ethernet interface, through the CMTS, and then onto the optical RF interfaces that are connected to the cable company's hybrid fiber coax (HFC) system. Downstream traffic is delivered from the CMTS to a cable modem in a subscriber's home, while upstream traffic is delivered from a cable modem in a subscriber's home back to the CMTS. Many modern CATV systems have combined the functionality of the CMTS with the video delivery system (EdgeQAM) in a single platform called the Converged Cable Access Platform (CCAP). Still other modern CATV systems called Remote PHY (or R-PHY) relocate the physical layer (PHY) of a traditional CCAP by pushing it to the network's fiber nodes. Thus, while the core in the CCAP performs the higher layer processing, the R-PHY device in the node converts the downstream data sent by the core from digital-to-analog to be transmitted on radio frequency and converts the upstream RF data sent by cable modems from analog-to-digital format to be transmitted optically to the core. Other modern systems push other elements and functions traditionally located in a head end into the network, such as MAC layer functionality (R-MAC-PHY), etc.

CATV systems traditionally bifurcated available bandwidth into upstream and downstream transmissions, i.e., data is only transmitted in one direction across any part of the spectrum. For example, early iterations of the Data Over Cable Service Interface Specification (DOCSIS) assigned upstream transmissions to a frequency spectrum between 5 MHz and 42 MHz and assigned downstream transmissions to a frequency spectrum between 50 MHz and 750 MHz. Later iterations of the DOCSIS standard expanded the width of the spectrum reserved for each of the upstream and downstream transmission paths. In the specification, the drawings, and the claims, the terms "forward path" and "downstream" may be interchangeably used to refer to a path from a head end to a node, a node to an end-user, or a head end to an end user. Conversely, the terms "return path" "reverse path" and "upstream" may be interchangeably used to refer to a path from an end user to a node, a node to a head end, or an end user to a head end.

One typical impairment of communications networks, and particularly those portions of networks that combine individual signals from many sources, is noise funneling. Examples of systems in which noise funneling occur include those that involve multiple antennae in wireless systems, multiple coaxial distribution legs in HFC cable systems, and optical combining of signals from several fibers in Passive Optical Networks (PON systems). Noise funneling occurs because each independent source contributes to noise irrespective of whether that path is also carrying a signal; when all paths are combined, the signal-to-noise ratio is therefore adversely affected. As used in this specification, the term "funneling noise" describe the resultant noise created by the noise funneling effect.

What is desired, therefore, are systems and methods that reduce funneling noise in communications systems.

BRIEF DESCRIPTION OF THE DRAWINGS

For a better understanding of the invention, and to show how the same may be carried into effect, reference will now be made, by way of example, to the accompanying drawings, in which:

FIG. 8 shows an exemplary modem mapping table for an RF distribution leg.

DETAILED DESCRIPTION

As noted earlier, many communication systems consist of a one-to-many topology in which a central master or server communicates with multiple clients over a shared medium. Forward path communication, from the server to one or more clients simultaneously, is relatively simple. However, the return path requires shared access to the medium; among the most common schemes for sharing the return path are time-division multiple-access (TDMA) and frequency-division multiple-access (FDMA). These multiple-access systems usually employ a Media Access Controller (MAC) to allocate time and/or frequency slots in which to send data on the return path; the specific element of the MAC which determines the allocations is often called a Scheduler (Upstream Scheduler or Return Path Scheduler). In many cases, the Scheduler is responsible for managing return path transmission bursts from clients using both TDMA and FDMA in a simultaneous fashion, scheduling data to be transmitted in a particular time/frequency slot.

Frequently in multiple-access systems it is necessary to combine return-path signals from several sources, each of which collect signals from a different location. Examples of this would be the use of multiple antennae in wireless systems, multiple coaxial distribution legs in HFC cable systems, and optical combining of signals from several fibers in Passive Optical Networks (PON systems). A problem arises with this kind of return-path signal combining: each source contributes noise to the combined return path, increasing the overall noise level. This phenomenon is sometimes referred to as "noise funneling". However, the desired signal level is not increased at the same time that the noise level is being increased, as only a single client is transmitting in a particular time/frequency slot on the whole network. As a result, the signal-to-noise-ratio (SNR) of the system is reduced below that which exists on each individual signal source.

Figure 1A:
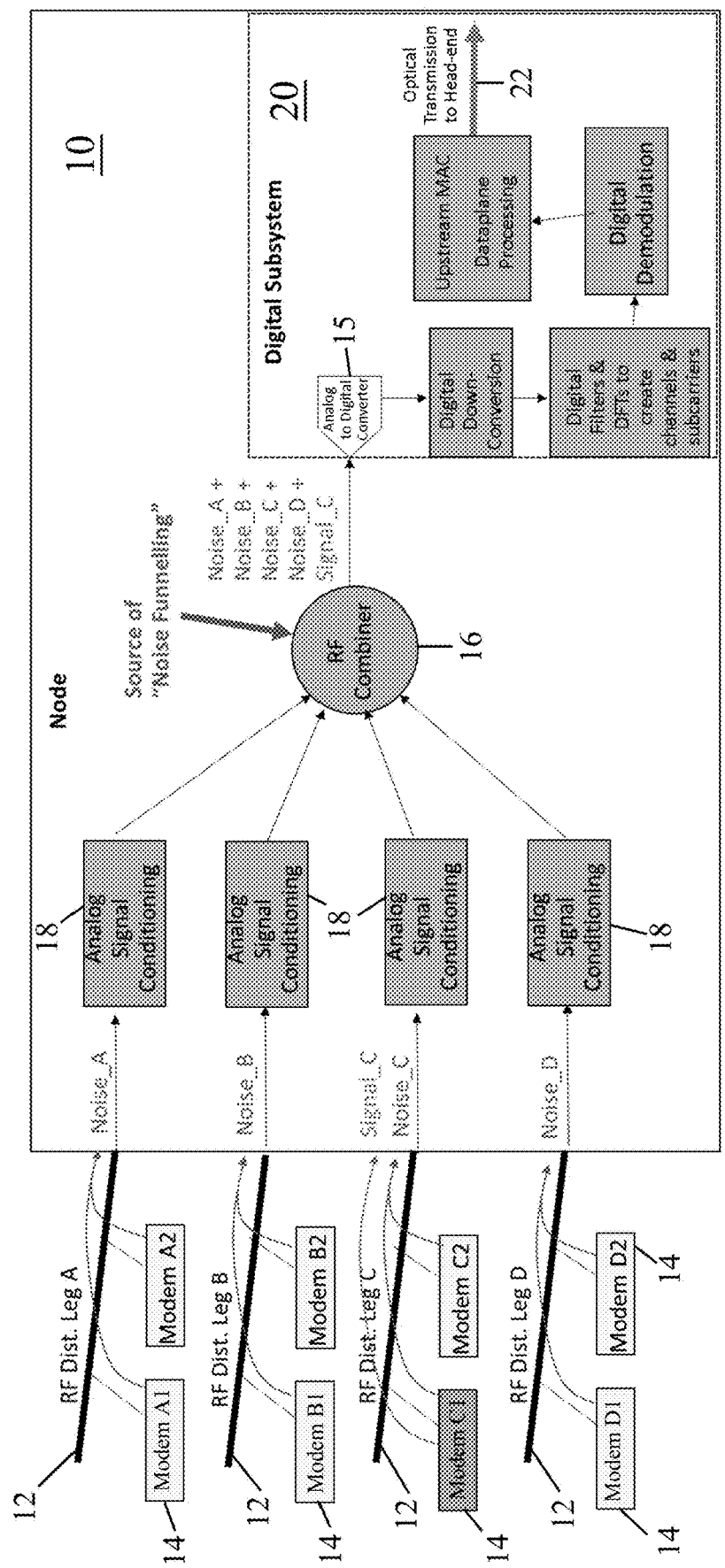
FIGS. 1 and 1B shows exemplary nodes in which funneling noise occurs in analog and digital upstream combining circuits, respectively.
Figure 1B:
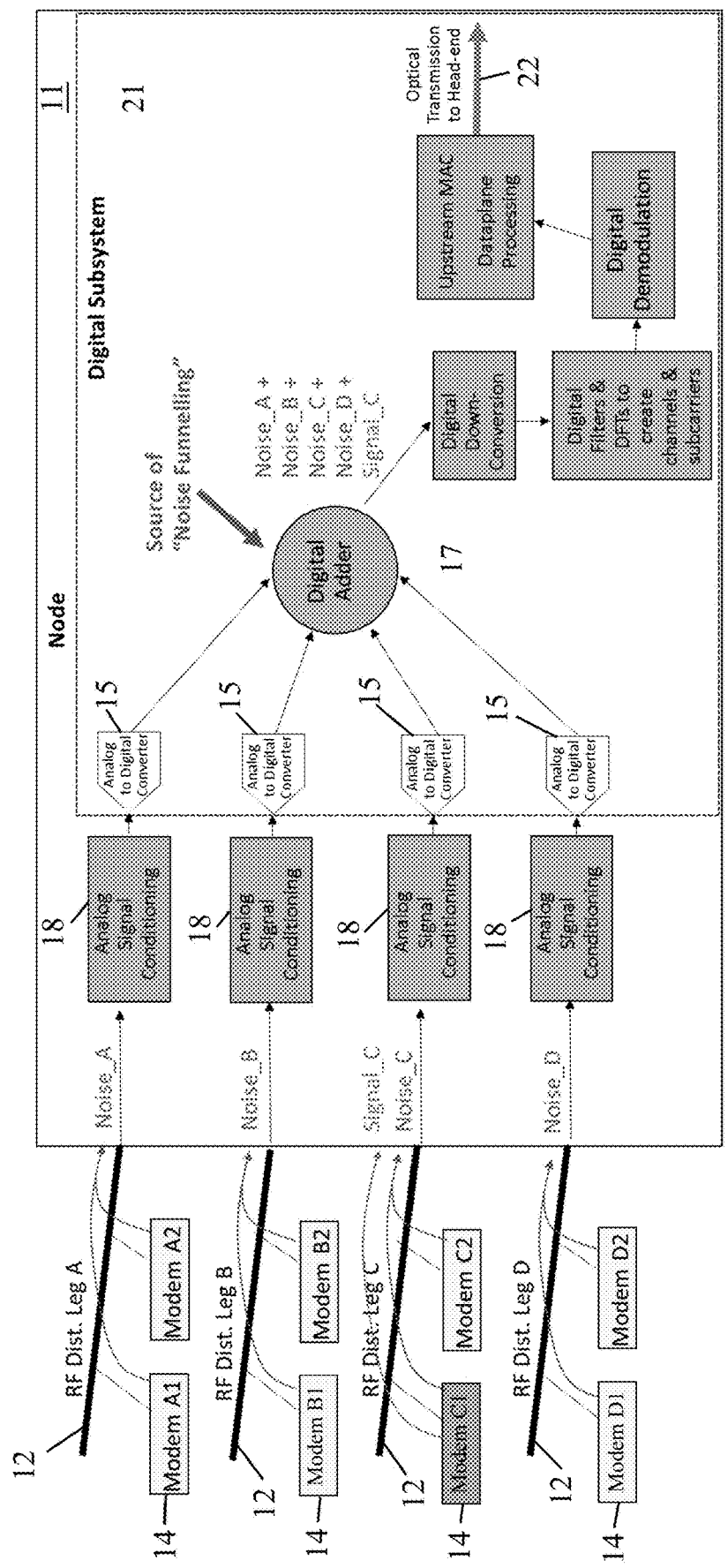

As a further example of this effect, consider a system as shown in FIGS. 1A and 1B. FIG. 1A shows a node 10 receiving signals from four RF distribution legs 12, each leg connected to a plurality of cable modems 14. Each distribution leg 12 feeds an RF combiner after conditioning by a respective one of analog signal conditioning units 18. A digital subsystem 20 receives the combined analog signal, converts it to a digital signal, and propagates it on an upstream optical fiber 22 towards a head end, CMTS, etc. FIG. 1B shows a similar node 11 that essentially operates in the same fashion as the node of FIG. 1A, except the digital subsystem 21 of FIG. 1B converts the incoming RF signals from the modem to respective digital signals via respective Analog-to-Digital Converter (ADC) units 15 prior to combining the upstream signals via a digital adder 17.

In either the node 10 of FIG. 1A or the node 11 of FIG. 1B, for a particular time/frequency slot, only a single client on a single coaxial distribution leg is transmitting a desired signal. However, the system necessarily must combine the feeds from all four legs to permit the desired signals from the four different legs to be received and processed (at different time/frequency slots) using a single set of receiver circuitry. Although sharing the receiver circuitry between all four distribution legs 12 helps reduce system costs, which is advantageous, unfortunately regardless of where the feeds are combined, the combining function combines the noise signals arriving from all four legs. If the average noise power in each leg is given by "N" dBmV and if the noise signals are random and uncorrelated, then the combined noise level after combining will therefore be (N+6) dBmV, yielding a ~6 dB rise in the total noise power level after combining of the four legs. If the desired signal power is limited to "S" dBmV, then the resultant Signal to Noise Ratio (SNR) is effectively reduced from S−N to S−(N+6), a reduction of ~6 dB, due to combining the RF legs through either the RF combiner 16 or the digital adder 17. In many QAM-based communication systems, this might result in the reduction of the QAM signal by two QAM modulation orders. As an example, if the system could have supported 1024-QAM (10 bits per symbol) on a single RF leg, then the system likely can only support 256-QAM (8 bits per symbol) after the combiner reduces the SNR by ~6 dB. This essentially reduces the system bitrate by about 20%, which is not desirable.

The present specification discloses novel devices, systems, and methods that mitigate noise funneling by first determining which signal source(s) (distribution leg) contains an upstream signal in any given time/frequency slot. This is achieved through a novel Client Locating system and a novel Scheduler subsystem, as will be described later in this specification. Once the particular RF distribution legs that contain signals are determined (and therefore the RF distribution legs that do not contain signals are also determined) the disclosed novel devices, systems, and methods only propagate signals from those distribution legs to a combiner/adder using a novel Steering sub-system, which does not require a combination of all RF signals from all distribution legs; rather the Steering subsystem allows the propagation of signals from only distribution legs in which the Client Locating System and Scheduler subsystem indicate as having a cable modem scheduled to transmit an upstream signal during any particular current frequency/time slot. In some embodiments, the Steering subsystem allows the propagation of signals from only a single distribution leg in which the Client Locating System and Scheduler subsystem indicate as having a cable modem scheduled to transmit an upstream signal during a particular current frequency/time slot, on the assumption that only cable modems along a single distribution leg are scheduled to transmit at any given time slot. Such systems may effectively eliminate the funneling noise effect and maximize the return-path SNR of the system.

As an example, consider a DOCSIS cable system. Many recent deployments of cable systems use a Distributed Access Architecture (DAA), in which a remote device called a node provides data and video services to several hundred households ordinarily within a distance of several hundreds of meters over coaxial cable. Typically, up to four cables emanate from a DAA node; each of these is called a distribution leg. In some cases, all households (customers) on all four distribution legs are treated as a single "Service Group" (SG), meaning that the downstream RF spectrum is identical on all legs, and the upstream spectrum is shared. Notably, this is the worst-case configuration for noise funneling, as the upstream signal from all four legs must be added together, either in the digital domain or the analog domain, before being processed by a receiver/demodulator. Other configurations are possible: there may be two service groups of two legs each, which reduces noise funneling effects by 3 dB (resulting in the QAM signal operation being reduced by perhaps only one QAM modulation order), or 4 service groups of one leg, which eliminates noise funneling altogether. However, configurations with more service groups have some disadvantages—principally higher system cost and higher power consumption.

Some compensatory systems may only pass frequency/time slots that display the largest signal power levels (as described, for example in U.S. patent Ser. No. 10/841,030), but those approaches suffer from several disadvantages. First, there is a time lag that is experienced between the arrival of signal power and the realization that the signal power is the highest power, which can lead to increases in system latency. Second, reliance on the signal power levels to determine which RF distribution legs are actually active within a particular frequency/time slot can lead to errors in selecting the correct RF distribution legs to be passed through to the output. These errors are exacerbated by noisy channels; especially if the noise power on the RF distribution leg may at times have high power levels that exceed the power levels of the arriving modem signal. This is quite likely to be the case when the noise in question is high-energy impulse or burst noise. In that case, the system would erroneously select the RF distribution leg with the high-powered noise as the source of the modem's signal and likely not select the correct RF distribution leg where the modem's signal actually resides, thereby degrading the channel's SNR instead of improving it.

On the cable system, there are two types of return path signal relevant to this disclosure: ATDMA (Advanced Time-Division Multiple-Access), which is a form of bursty single-carrier QAM channel, and OFDMA (Orthogonal Frequency-Division Multiple-Access), which is a multiple-access version of the popular OFDM modulation scheme. Both of these channel types are potentially subject to performance degradation by noise funneling, and the performance of both channel types can be improved using the disclosed device, systems, and methods.

A typical node uses analog-to-digital converters to sample the return RF signal on each leg, following some preliminary analog signal conditioning. If analog combining is used (as in FIG. 1A), then the signals are combined within an RF combiner in the analog domain (which is where the funneling noise occurs), and the combined output is sent to a single Analog-to-Digital Converter. The sample signal would then be down-converted and filtered to segment it into individual channels, and in the case of OFDMA, would be further divided into subcarriers using a Discrete Fourier Transformation (DFT) before being fully demodulated into data streams.

If digital combining is used (as in FIG. 1B), then a separate Analog-to-Digital Converter (ADC) is assigned to each individual RF distribution leg. The digitized signals from the different legs in each SG would then be digitally added together before further processing, producing the funneling noise described above. They would then be down-converted and filtered to segment them into individual channels, and in the case of OFDMA, would be further divided into subcarriers using a DFT process before being fully demodulated into data streams.

Figure 2A:
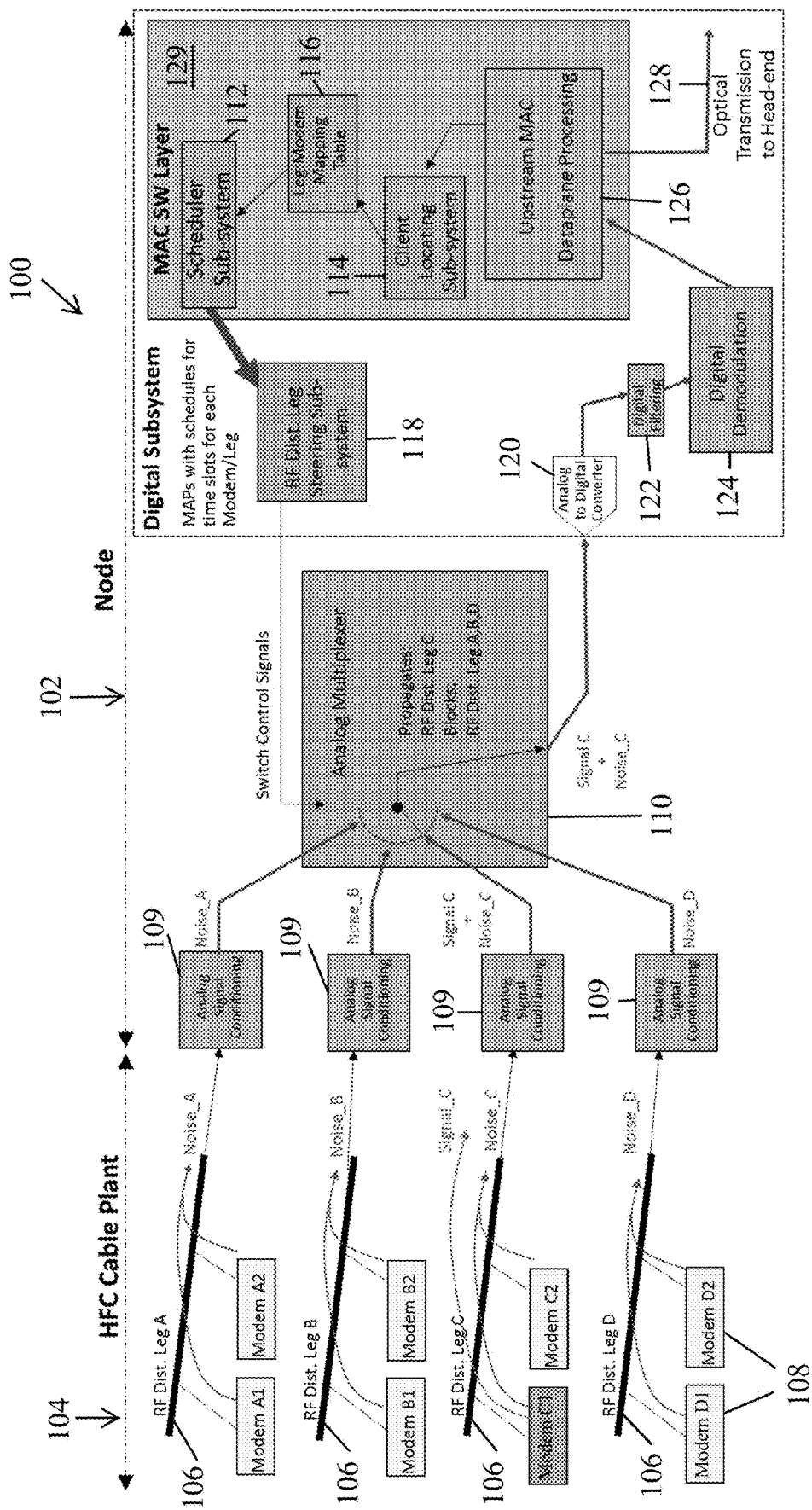
FIG. 2A shows an exemplary embodiment of a novel Scheduler-Directed Source Multiplexing (SDSM) system with an analog multiplexer for a plurality of upstream ADTMA signals.

FIG. 2A shows an exemplary embodiment of a system 100 having a node 102 connected to an HFC cable plant 104 having a plurality (e.g., four) RF distribution legs 106, each distribution leg propagating upstream signals from one or more cable modems 108. In this exemplary system, it is assumed that the cable modems transmit upstream according to an ATDMA scheme, and is further assumed that only one client modem is scheduled to transmit on the ATDMA channel frequency range in any timeslot; this permission is communicated to a modem as a "grant." The set of all grants in a configurable time period is called a MAP.

Unlike the systems shown in FIGS. 1A and 1B, however, the node 102 includes a digital subsystem having access to a scheduler subsystem 112, a client locating subsystem 114, and a Steering subsystem 118. As described later, the client locating subsystem 114 may in some embodiments preferably have access to a Leg:modem mapping table that maps each modem 108 to the particular leg that it propagates upstream signals on. In a preferred embodiment, all of these subsystems are implemented in processing devices contained within the node 102, and more preferably performed via MAC layer 129 processing in the node. However, those of ordinary skill in the art will appreciate that the functionality of each of the subsystems 112, 114, 116, and 118 may be located elsewhere in a system, e.g., in a head end or Cable Modem Termination System (CMTS) upstream of the node, which may be appropriate in Remote Physical Device (R-PHY) architectures where the node 102 lacks MAC layer processing capabilities.

In the system of FIG. 2A, the MAC software layer 130 includes upstream MAC dataplane processing 126 preferably comprises a scheduler subsystem 112 whose function is to implement upstream reservation MAPs that schedule upstream transmissions by specific cable modems 108 at specific times, and preferably at specific frequencies. In the system of FIG. 2A, the MAC software layer 129 also includes upstream MAC dataplane processing 126 that has access to the client locating subsystem 114 whose function is to identify the location of any particular modem for which an upstream grant is scheduled. In some embodiments, the client locating subsystem 114 has access to a leg:modem mapping table 116, which associates individual cable modems 108 with the specific RF leg 106 input to the node 102. Thus, one of ordinary skill in the art can easily appreciate that the combination of the scheduler subsystem 112 and the client locating subsystem 114 permits the identification of which leg(s) 106 are carrying signals at any given scheduled time interval, and just as importantly, which leg(s) 106 are not carrying signals at any given scheduled time interval.

The leg:modem mapping table 116, if included, can be populated in any number of appropriate manners. For example, one technique would simply have the operator create an archived list of RF distribution legs and all of the modems that are attached to it, based on the addresses of the homes to which the modems were assigned. Another technique would be based on scheduling each modem to transmit alone on a particular time/frequency slot, and the client locating sub-system 114 can monitor the arriving signal on each of the RF distribution legs (in either the analog domain or the digital domain) to determine on which RF distribution leg the expected modem signal has arrived. This action can be repeated multiple times to yield close to 100% accuracy. Yet another technique could block the signal paths on all but one of the RF distribution legs and instruct the modem to transmit and determine if the signal arrives at the node; if so, then it is attached to the one un-blocked RF distribution leg. If the signal does not arrive, then it is assumed to be on another RF distribution leg, and the same experiment may be carried out on the other RF distribution legs. Another, similar technique, would be to connect one RF distribution leg at a time to the receiver circuits, and allow the normal modem registration process to take place; all modems which successfully registered would then be known to reside on the connected leg. Alternatively, the scheduler could assign transmission opportunities to individual modems in particular timeslots where only one of the distribution legs was connected (for that mini-slot). These grants could be for a normal transmission such as periodic ranging or Proactive Network Management (PNM); if the transmission was received, that would confirm that that modem resided on the selected leg, otherwise, the procedure would be repeated on the other legs, and then repeated for every modem to build up a table of modem locations. Regardless of how the information is collected within the client locating subsystem 114, this information could then be utilized to build an automatically-generated, archived list of RF distribution legs and all of the modems that are attached to it. An example of a resultant RF distribution leg:modem mapping table is shown in FIG. 8.

The node 102 also preferably includes a steering subsystem 118, which based on the data from the scheduler subsystem 112 and the client locating subsystem 114, controls multiplexer or switch 110 using switch signals so as to connect ADC 120 to only those RF legs 105 scheduled to transmit during any given upstream transmission interval. Therefore, only signals arriving from an RF leg on which a transmitting modem was scheduled to transmit in a current timeslot are passed through. During the next timeslot, the signals sampled from a different modem might be collected from the same RF leg, or a different RF leg. Those of ordinary skill in the art will understand that the selection of the RF leg that is passed through to the output can be done in either the analog domain (e.g., with selectable switches that feed only the selected RF leg through to the output) or in the digital domain (e.g., with separate ADCs assigned to each of the separate RF legs, and then using digitally-controlled multiplexing circuits in the digital logic that steer only the selected sampled RF leg signal through to the output. In either case, the ATDMA channel is then reconstructed by selectively concatenating time-domain samples from the contiguous timeslots collected from potentially different RF legs, resulting in a "clean" channel with all of the transmitted signals in different timeslots, where the SNR on such signals greatly improved because the noise from only one RF leg is propagated through to the output. This greatly reduces the overall noise. This "clean" channel signal is then demodulated by receiver circuitry as normal.

Specifically, as can be seen in FIG. 2A, if modem C1 is transmitting in the upstream in a given time slot, the scheduler 112 will have scheduled that transmission and thus can instruct the multiplexer 110 to position itself in the configuration shown where only the RF leg 106 that modem C1 is on is connected to ADC 120, and no other RF legs are connected to ADC converter 120. The digitally converted signal is the provided to optional digital filtering module 122 and digital demodulation module 124, and then the MAC dataplane processing 126 forwards the "clean" upstream signal from modem C1 towards the head end on fiber 128. Those of ordinary skill in the art will appreciate that, in the case of digital selection, the circuitry described above can be replicated X times to support X ATDMA channels on a single Upstream Spectrum, with each ATDMA channel being separated (via filtering) from the others.

In the foregoing description of FIG. 2A, it was assumed that only one cable modem, from one RF leg, was allowed to transmit upstream at any given interval, in which case the ADC 120 would not combine upstream data signals from different RF legs. Other embodiments may permit more than one cable modem on a particular RF leg 106 to transmit simultaneously, but at different frequencies, or in still other embodiments may also permit multiple cable modems from different legs to at times transmit simultaneously, but at different frequencies. As described in the previous paragraph, the X different frequency ranges would need to be appropriately separated (via filtering) and fed through X versions of the selection circuitry before the X versions are re-combined by adding them back together. In this latter case, the multiplexer 110 could be implemented as a digital switch, and any addition of upstream data signals is delayed until after the SDSM process, which would occur after down-conversion and channel filtering, and (in some cases as shown in later figures) after a DFT process. Thus, whenever a circumstances arises where upstream signals are not present on any given RF distribution leg 106, funneling noise would still be reduced.

Figure 2B:
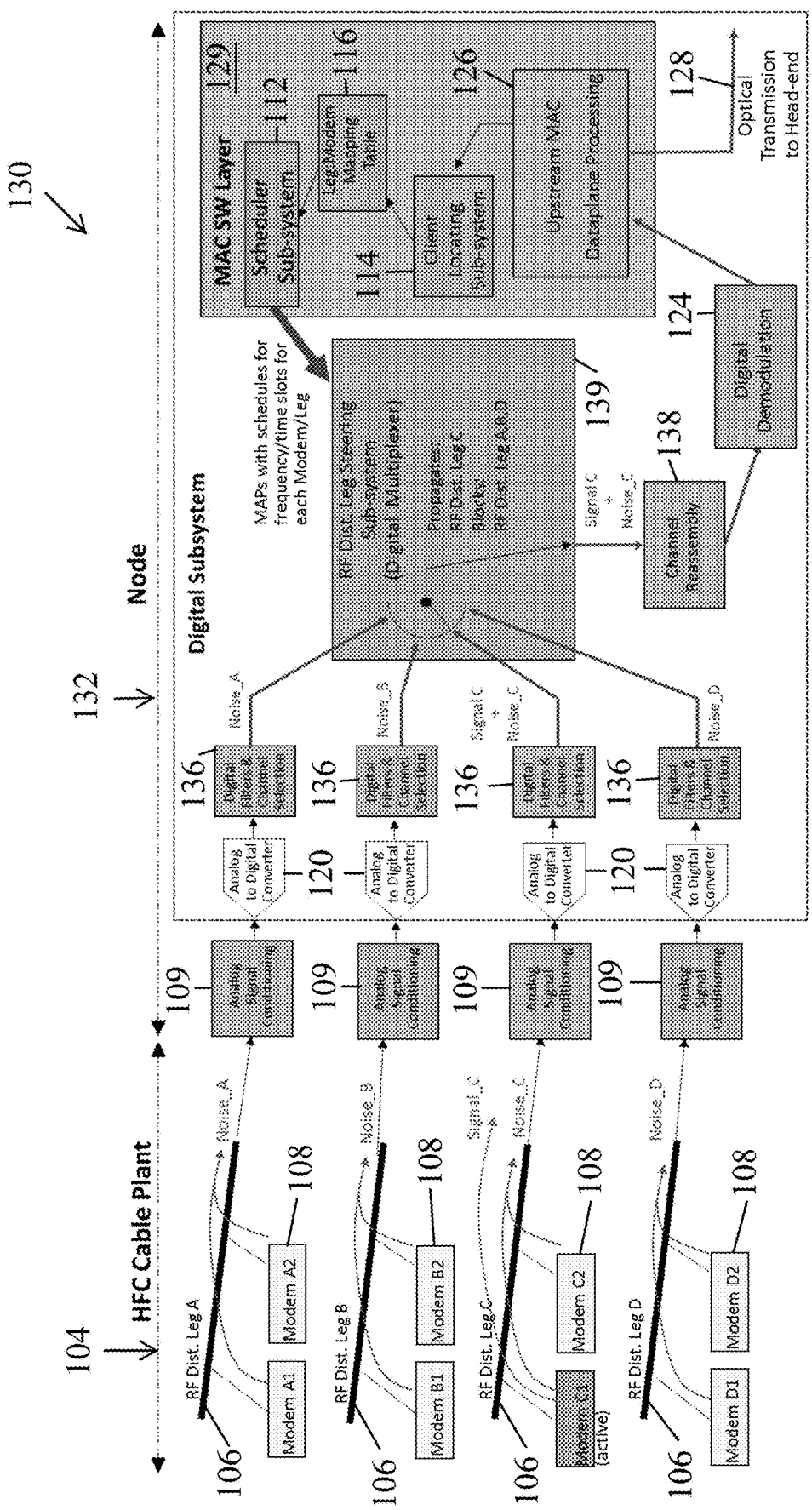
FIG. 2B shows an exemplary embodiment of a novel (SDSM) system with a digital multiplexer for a plurality of upstream ADTMA signals.

FIG. 2B shows an alternate embodiment of a system 130 having a node 132 that, like the system of FIG. 2A, is connected to an HFC cable plant 104 having a plurality (e.g., four) RF distribution legs 106, each distribution leg propagating upstream signals from one or more cable modems 108. In the exemplary system of FIG. 2B, however, a digital multiplexer 139 is used rather than an analog multiplexer, and separate ADCs 120 are preferably assigned to each of the separate RF legs 106. The output of each ADC 120 is fed to a respective digital filter and channel selection module 136. The digital multiplexer 139 is used to select only those RF legs 106 having a scheduled upstream transmission in a given time slot, and provide that scheduled signal to channel reassembly unit 138 and digital demodulation unit 124 before the upstream MAC dataplane processing 126 sends the signal further upstream on optical fiber 128.

Figure 2C:
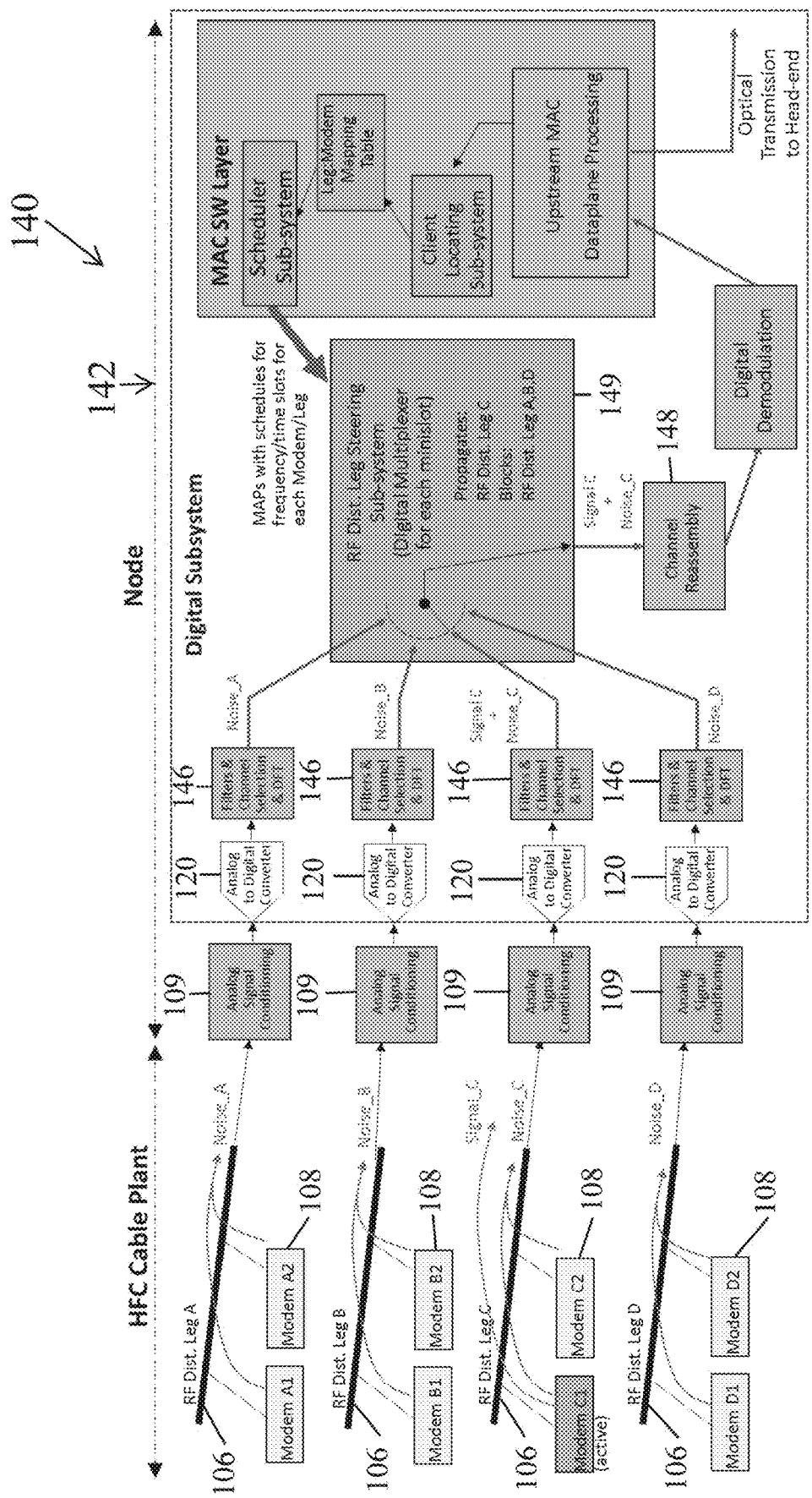
FIG. 2C shows an exemplary embodiment of a novel (SDSM) system with a digital multiplexer for a plurality of upstream OFDMA signals.

FIG. 2C shows another alternate embodiment where cable modems 106 are configured to communicate OFDMA signals rather than ATDMA signals. In the case of an OFDMA channel, the scheduler subsystem 112 allocates grants to modems, grouped in MAPs, in a similar fashion to that described above with respect to FIGS. 2A and 2B. The main difference is that each grant is for a number of "mini-slots", where mini-slots exist in an effective two-dimensional space made up of time in one dimension and frequency (subcarriers) in the second dimension. A single mini-slot is transmitted by a single modem, and that mini-slot consists of a number of OFDMA subcarriers (usually a small subset of the many OFDMA subcarriers within the OFDMA channel) for a fixed time duration. To implement SDSM for OFDMA, separate Analog-to-Digital Converters 120 are preferably assigned to each of the separate RF legs 106. In addition, a separate DFT must be performed on each down-converted OFDMA channel on each RF leg to separate the OFDMA channel from each RF leg into its constituent subcarriers. This DFT is implemented in filter, channel selection, and DFT units 146. A single modem's transmission will be scheduled by the scheduler to place its transmissions on a subset of the resultant subcarriers associated with its single RF leg 106. The MAP information can then be used to determine which RF leg and which subcarriers on that RF leg have active transmissions occurring at any time.

Only the signals sampled and DFT-processed from the RF leg and from the particular subset of subcarriers on which the transmitting modem was known to be on are passed through to the output during the timeslot that the transmitting modem was using. Other modems using other subcarriers on the same RF leg or on different RF legs can be passing at the same time, and the particular RF leg and subset of subcarriers associated with those other modems are also selected to be passed through to the output. Unused subcarriers on a particular RF leg are essentially "zeroed out" by the processing block to suppress any funneling noise that might have been propagating up from that particular RF leg. During the next timeslot, the ADC-sampled signals sampled from a different set of modems might be collected from the same RF leg or a different RF leg on the same subcarriers or different subcarriers. Selecting which particular subcarrier signals are passed through to the output can be done using digitally-controlled multiplexing circuits in the digital logic that steer only the selected sampled subcarrier from a particular RF leg signal through to the output. This is the functionality that essentially "zeroes out" and suppresses any funneling noise on a particular RF leg.

The OFDMA channel is then reconstructed by selectively assembling time/frequency samples collected from potentially different RF legs and different subcarriers on those RF legs, resulting in a "clean" channel with all of the transmitted signals in different time/frequency slots, but the SNR on those signals has been greatly enhanced since the noise from only one RF leg is propagated through to the output within any subcarrier at any given time. This greatly reduced the overall noise. This "clean" channel signal is then demodulated by receiver circuitry as normal.

Figure 3:
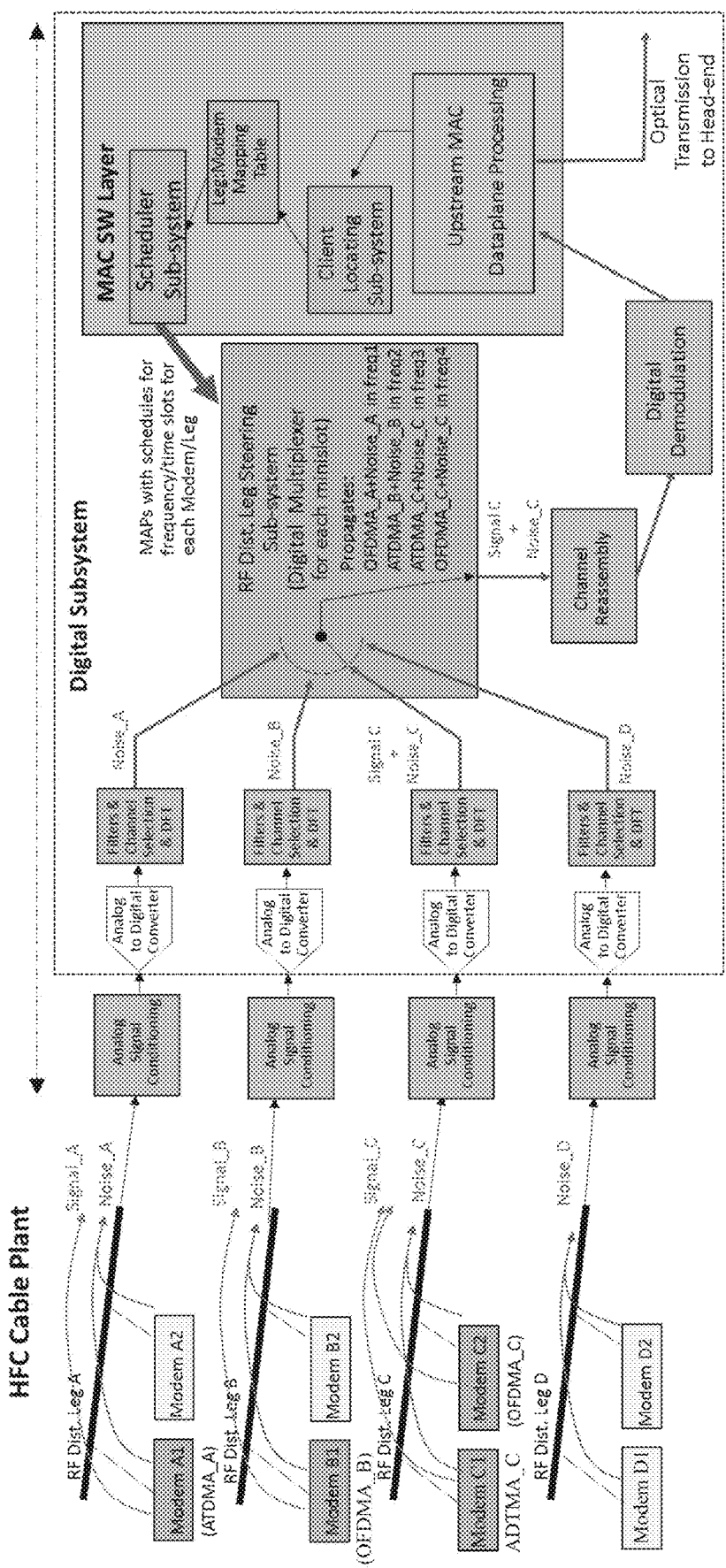
FIG. 3 shows an exemplary embodiment of a novel (SDSM) system with a digital multiplexer for a plurality of upstream OFDMA and ATDMA channels.

Again, it will be understood by those of ordinary skill in the art that the circuitry described above can be replicated Y times to support Y OFDMA channels on a single Upstream Spectrum, with each OFDMA channel being separated (via filtering) from the others. It will also be recognized that combinations of X ATDMA channels and Y OFDMA channels on a single Upstream Spectrum can also be supported, with each of the channels being separated (via filters) from the others before being fed to the replicated circuitry. An example with two ATDMA channels and two OFDMA channels sharing a single Upstream Spectrum is shown in FIG. 3. In further embodiments, combinations of analog and digital selection sub-systems are also permitted. For example, a system with analog selection for ATDMA channels and digital selection for OFDMA channels could be implemented, with a final reconstruction that occurs in the digital domain. Further, reconstruction of the signals could also be accomplished in the analog domain, following appropriately positioned DACs. All such combinations are combinations in the figures, but it should be understood by those skilled in the art that many different combinations of analog and digital solutions are possible.

Figure 4:
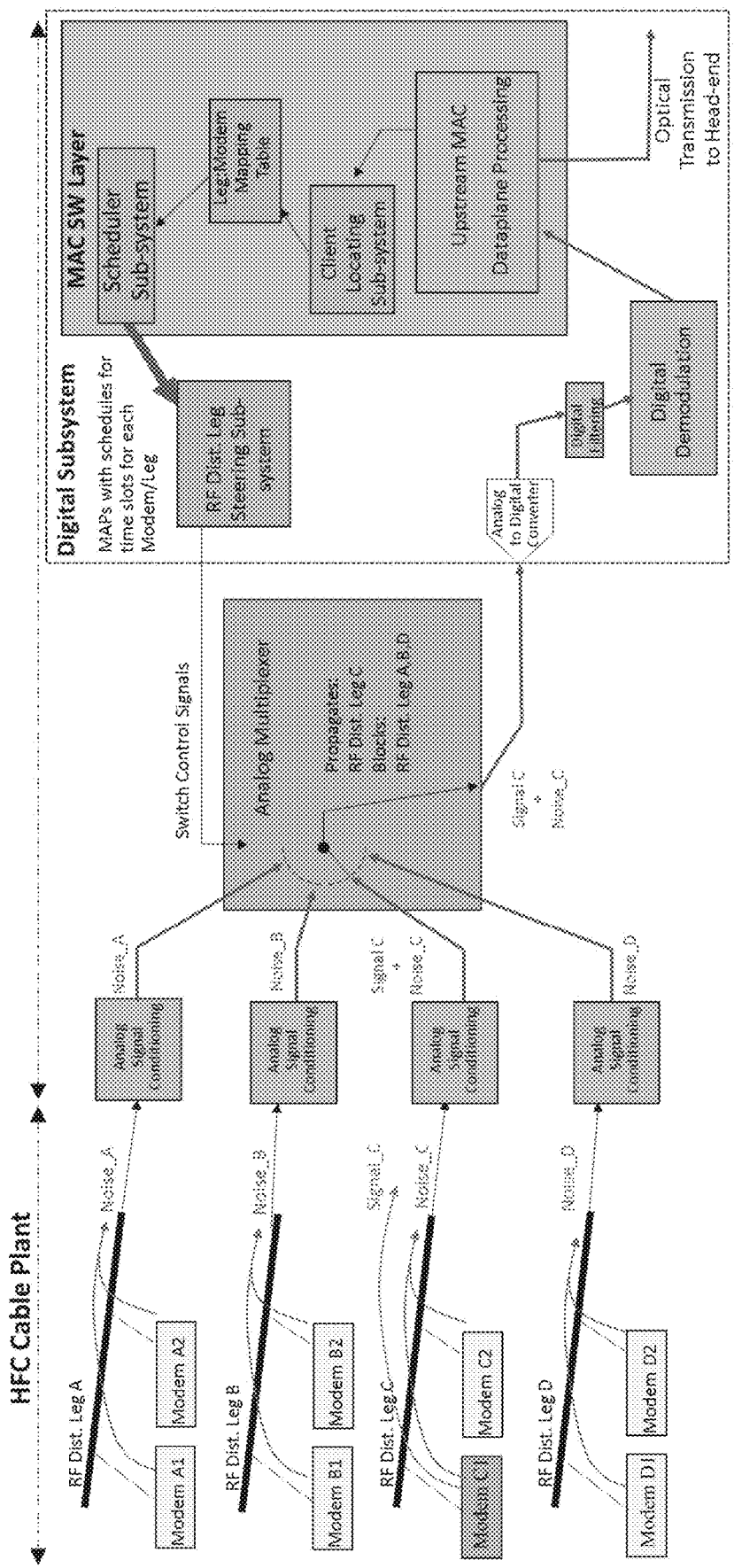
FIG. 4 shows an alternate exemplary embodiment of a novel (SDSM) system with an analog multiplexer for a plurality of upstream OFDMA signals.
Figure 5:
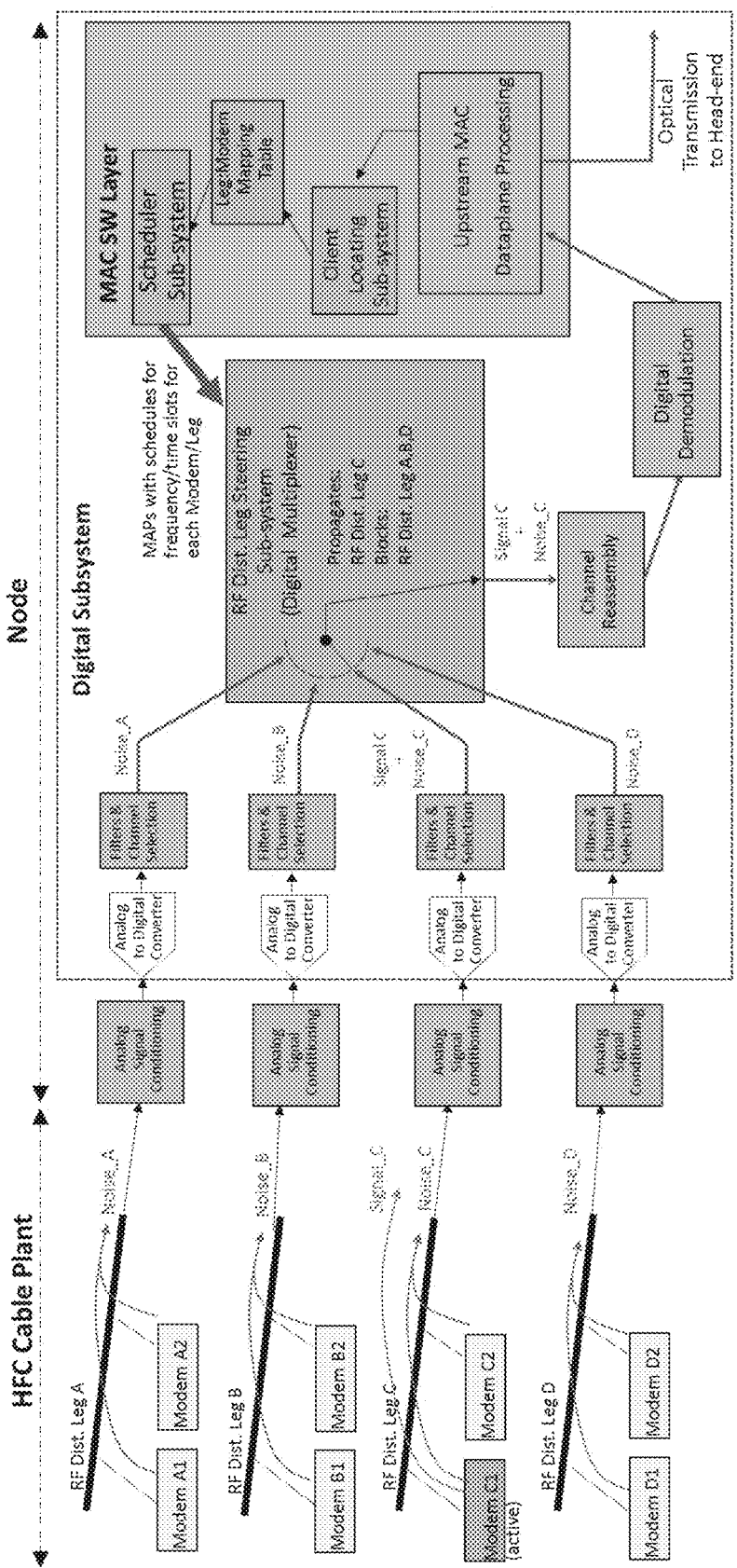
FIG. 5 shows an alternate exemplary embodiment of a novel (SDSM) system with a digital multiplexer for a plurality of upstream OFDMA signals.

In a further embodiment, the scheduler subsystem 112 may allocate all subcarriers on an OFDMA channel entirely to only modems on a single RF leg at any given time. In this case, there would be no need to perform a DFT on the OFDMA channel before implementing the SDSM leg-selection process, because all of the subcarriers being passed through to the output will be associated with the single RF leg. As a result, SDSM would operate exactly as it does for a single ATDMA channel, and the selection of the particular RF leg at any point in time can be done in either the analog domain (e.g., with selectable switches that feed only the selected RF leg through to the output as in FIG. 4) or in the digital domain (e.g., with separate Analog-to-Digital Converters assigned to each of the separate RF legs and then using digitally-controlled multiplexing circuits in the digital logic that steer only the selected sampled RF leg signal through to the output as in FIG. 5). In either case, the OFDMA channel is then reconstructed by selectively concatenating time-domain samples from the contiguous timeslots collected from potentially different RF legs, resulting in a "clean" channel with all of the transmitted signals in different timeslots, but the SNR on those signals has been greatly enhanced since the noise from only one RF leg is propagated through to the output. This greatly reduces the overall noise. This "clean" channel signal is then demodulated by receiver circuitry as normal.

Figure 6:
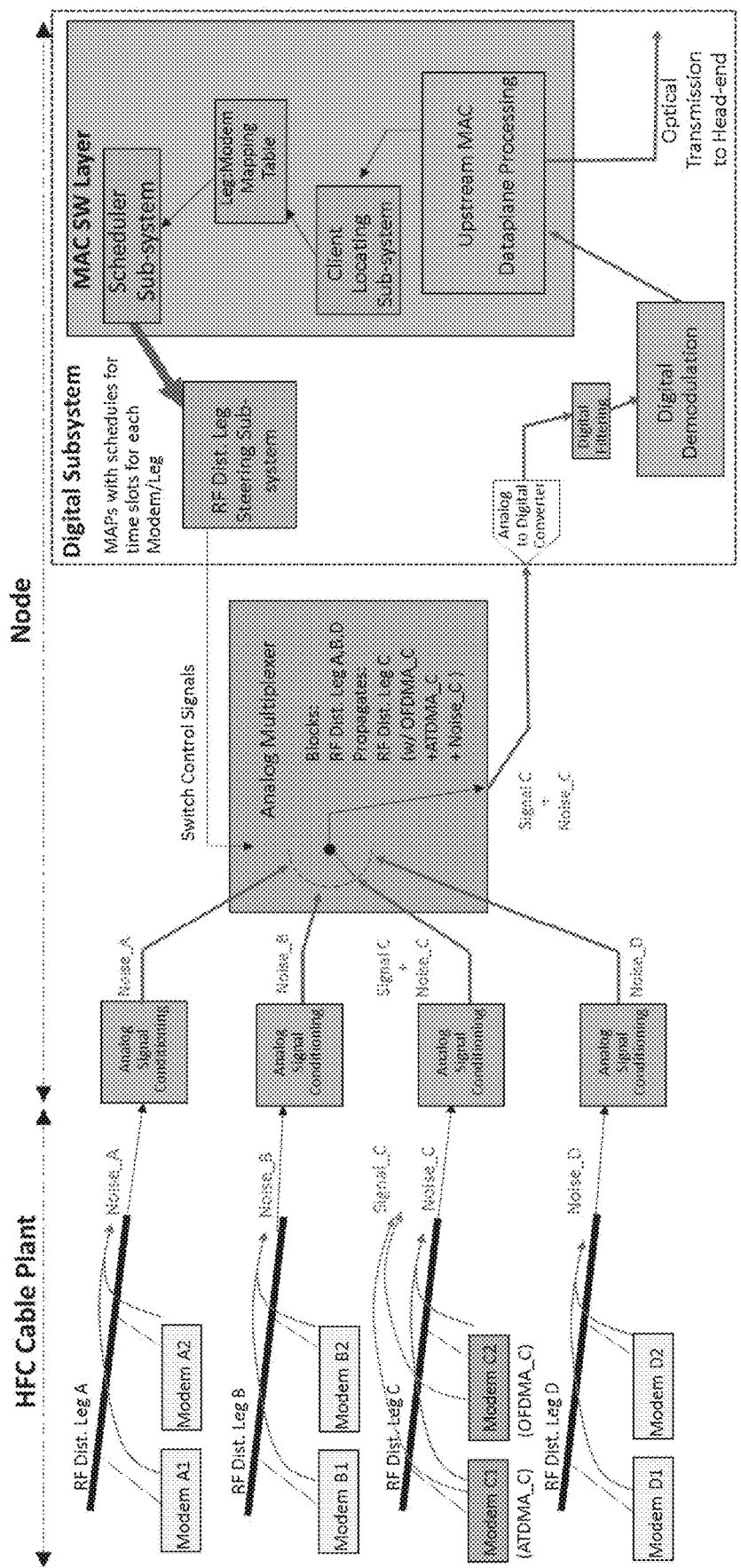
FIG. 6 shows an alternate exemplary embodiment of a novel (SDSM) system with an analog multiplexer for a plurality of upstream OFDMA and ATDMA channels
Figure 7:
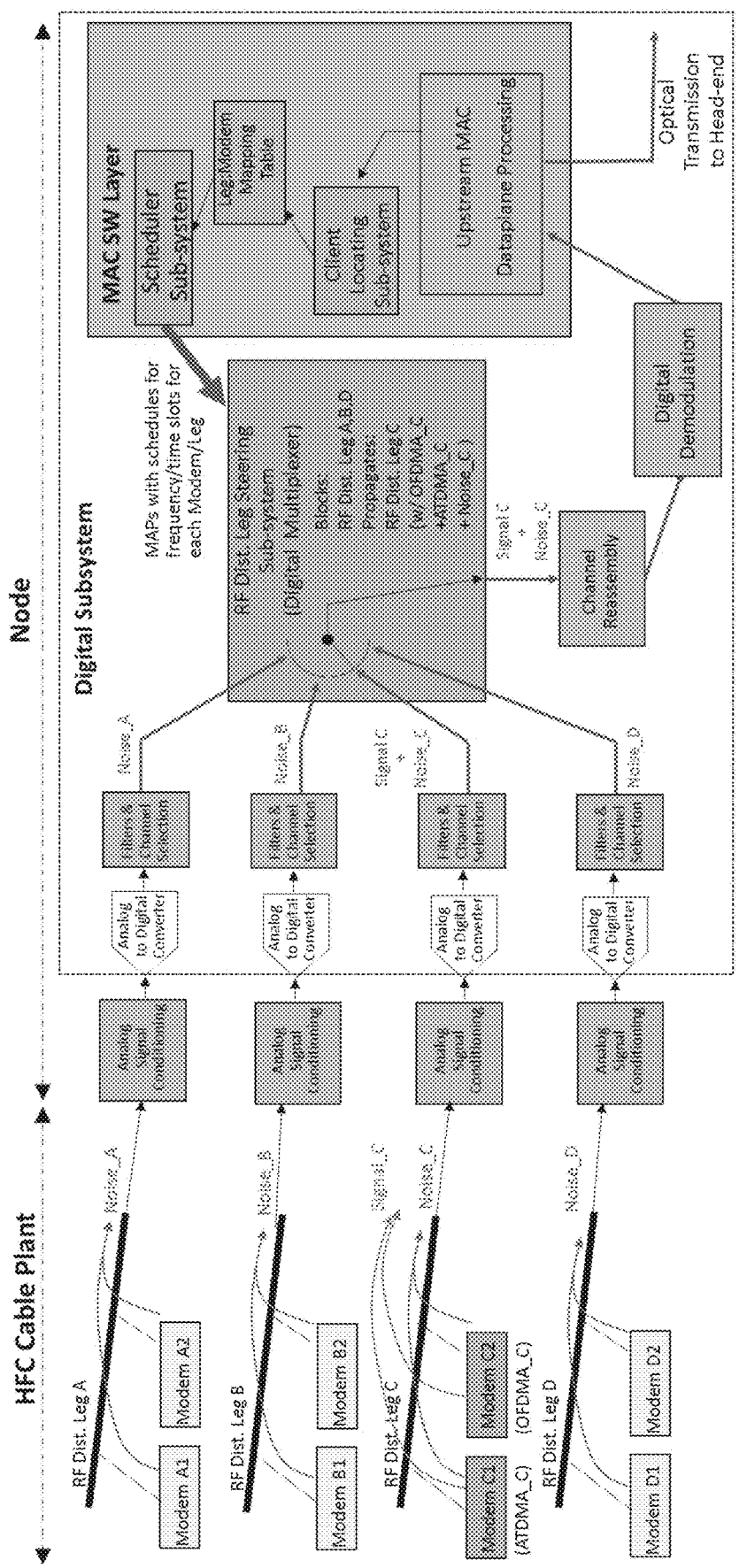
FIG. 7 shows another alternate exemplary embodiment of a novel (SDSM) system with a digital multiplexer for a plurality of upstream OFDMA and ATDMA channels.

In still another embodiment case, the scheduler subsystem 112 may allocate all ATDMA channels and all OFDMA channels and all subcarriers within each of those OFDMA channels within the Upstream spectrum entirely to only modems on a single RF leg at any given time. In this case, there would be no need to perform a DFT on the OFDMA channels before implementing the SDSM leg-selection process, because all the subcarriers being passed through to the output will be associated with the single RF leg 106. As a result, SDSM would operate exactly as it does for a single ATDMA channel, and the selection of the particular RF leg 106 at any point in time can be done in either the analog domain (e.g., with selectable switches that feed only the selected RF leg 106 through to the output as in FIG. 6) or in the digital domain (e.g., with separate Analog-to-Digital Converters assigned to each of the separate RF legs and then using digitally-controlled multiplexing circuits in the digital logic that steer only the selected sampled RF leg signal through to the output as in FIG. 7). In either case, the ATDMA and OFDMA channels sharing the Upstream Spectrum are then reconstructed by selectively stringing together time-domain samples from the contiguous timeslots collected from potentially different RF legs, resulting in a "clean" channel with all of the transmitted signals in different timeslots, but the SNR on those signals has been greatly enhanced since the noise from only one RF leg is propagated through to the output. This greatly reduces the overall noise. This "clean" channel signal is then demodulated by receiver circuitry as normal.

It will be appreciated that the invention is not restricted to the particular embodiment that has been described, and that variations may be made therein without departing from the scope of the invention as defined in the appended claims, as interpreted in accordance with principles of prevailing law, including the doctrine of equivalents or any other principle that enlarges the enforceable scope of a claim beyond its literal scope. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated. The word "comprise" or a derivative thereof, when used in a claim, is used in a nonexclusive sense that is not intended to exclude the presence of other elements or steps in a claimed structure or method.

The invention claimed is:

1. A node configured to receive respective scheduled upstream data signals from each of a plurality of modems and propagate received signals further upstream, each modem connected to the node by a respective one of at least two Radio Frequency (RF) legs, the node comprising a steering subsystem configured to control a switch to selectively isolate the respective scheduled upstream data signals from noise present on any said RF leg not propagating a scheduled upstream data signal, the switch controlled using information from reservation MAPSs, provided to the steering subsystem by a scheduler subsystem, and which define a predetermined schedule of upstream transmissions for each of the plurality of modems.

2. The node of claim 1 including a scheduler subsystem that provides the steering subsystem with schedule information from reservation MAPs.

3. The node of claim 1 including a client locating subsystem that provides the steering subsystem with location information for each of the plurality of cable modems.

4. The node of claim 3 where the location information associates each cable modem with a respective one of the at least two RF legs.

5. The node of claim 1 configured to process Advanced Time Division Multiple Access (ADTMA) signals from the plurality of modems.

6. The node of claim 1 configured to process Orthogonal Frequency Division Multiple Access (OFDMA) signals from the plurality of modems.

7. The node of claim 1 where the switch is an analog switch.

8. The node of claim 1 where the switch is a digital switch.

9. A method of operating a node configured to receive respective scheduled upstream data signals from each of a plurality of modems and propagate received signals further upstream, each modem connected to the node by a respective one of at least two Radio Frequency (RF) legs, the method comprising:
  receiving scheduling information associating a time slot with respective cable modems scheduled to provide upstream data signals to the node; and
  operating a switch in the node to isolate any said RF leg from the scheduled upstream data signals during said time slot not scheduled to propagate a signal during said time slot, the switch controlled using information from reservation MAPSs, which define a predetermined schedule of upstream transmissions for each of the plurality of modems.

10. The method of claim 9 where the schedule information is based on a reservation MAP.

11. The method of claim 9 where the scheduled upstream data signals are Advanced Time Division Multiple Access (ADTMA) signals.

12. The method of claim 9 where the scheduled upstream data signals are Division Multiple Access (OFDMA) signals.

13. The method of claim 9 where the scheduled upstream data signals are analog signals.

14. The method of claim 9 where the scheduled upstream data signals are digital signals.

15. The method of claim 9 including receiving location information of cable modems scheduled to provide upstream data signals during the time slot.

16. A node configured to receive respective scheduled upstream data signals from each of a plurality of modems and propagate received signals further upstream, each modem connected to the node by a respective one of at least two Radio Frequency (RF) legs, the node configured to associate upstream transmission schedule information for a cable modem, received from reservation MAPs that define a predetermined schedule of upstream transmissions for each of the plurality of modems, with location information for a cable modem defined in a mapping table that associates each cable modem with a respective one the at least two RF legs.

17. The node of claim 16 configured to operate a switch of the node based on the association of the upstream transmission schedule information for the cable modem with the location information for the cable modem.

18. The node of claim 17 where the location information associates the cable modem with a respective one of the at least two RF legs.

19. The node of claim 16 where the association of the upstream transmission schedule information for the cable modem with the location information for the cable modem is based on a mapping table stored in the node.

20. The node of claim 19 where the mapping table is constructed based on upstream signals received by the node.

* * * * *